United States Patent [19]

Romankiw et al.

[11] 4,432,855
[45] Feb. 21, 1984

[54] AUTOMATED SYSTEM FOR LASER MASK DEFINITION FOR LASER ENHANCED AND CONVENTIONAL PLATING AND ETCHING

[75] Inventors: Lubomyr T. Romankiw, Briarcliff Manor; Robert J. von Gutfeld, New York, both of N.Y.

[73] Assignee: International Business Machines Corporation, Armonk, N.Y.

[21] Appl. No.: 429,657

[22] Filed: Sep. 30, 1982

[51] Int. Cl.³ .............................................. C25D 17/00
[52] U.S. Cl. .................................... 204/207; 204/210
[58] Field of Search ................................ 204/206–211, 204/224 R

[56] References Cited

U.S. PATENT DOCUMENTS 3,791,938  2/1974  Healy ................................... 204/207
4,217,183  8/1980  Melcher ......................... 204/224 R Primary Examiner—T. M. Tufariello
Attorney, Agent, or Firm—Graham S. Jones, II

[57] ABSTRACT

A laser enhanced electroplating system or etching system or conventional electroplating or etching system includes a continuous electrochemical processing system with a sheet of material to be treated electrochemically passed from a supply roller to a plating bath and out over an exit roller with the plating system under automatic control. A rinse-tank is also proved in series with the plating tank. The sheet to be treated electrochemically can be coated with a protective film which prevents electrochemical action from occurring where it is present, but which sheet can be removed in a predetermined location. One removes the protective film where desired to provide a mask by means of a laser which is scanned under automatic control. Then the plating or etching operation occurs through the openings in the mask. A rinse-tank contains a solvent capable of removing the mask from the sheet subsequent to the plating or etching operation. An array of lasers can be employed. An array of lasers can be multiplexed, synchronously activated or pulsed. The electrochemical operation can be performed with the concomitant application of energy from the laser in order to enhance the chemical action in areas from which the masking (protective) film has been removed. The laser can be scanned by means of a mirror, which oscillates or can be fixed. The masking material is composed of an organic material such as glycol phthalate, paraffin, photoresist, gelatin, etc.

15 Claims, 5 Drawing Figures

AUTOMATED SYSTEM FOR LASER MASK DEFINITION FOR LASER ENHANCED AND CONVENTIONAL PLATING AND ETCHING

BACKGROUND OF THE INVENTION

1. Field of the Invention

This invention relates to plating or etching of metals onto or from a substrate with or without laser enhancement and more particularly to employment of masking techniques to enhance the process of plating, or etching.

2. Description of the Prior Art

Electroplating:

In electroplating, an anode and a cathode are placed in an electrolyte and an external voltage is applied from a power supply to produce a plating current. The current flow causes cations (metal ions) to be transported to the cathode where they are deposited.

U.S. Pat. No. 4,217,183 of Melcher et al for "Method for Locally Enhancing Electroplating Rates" describes maskless electroplating with the enhancement provided by using an electromagnetic beam such as a laser beam to increase the plating rate preferentially in a selected area up to 1,000 times the rate which would have been achieved in the absence of the laser beam. The increased rate of plating occurs while the laser beam is directed upon the areas of a substrate to be plated and the beam is scanned with a rotating mirror. The process is a sequential process. The beam has a power in the range from 100 w/cm$^2$ to 1,000,000 w/cm$^2$ at the focal spot where plating is occurring.

U.S. Pat. No. 3,898,417 of Atkinson for "Continuous Strip Encoding" describes laser coating of a continuous strip of metal sheet. The coding can be applied to the sheet before or after plating. The coding provides indices which can be read subsequently and has nothing to do with the plating process itself. An array of laser elements for forming coding marks is shown. The patent does not relate to masking.

Masking:

U.S. Pat. No. 3,956,077 of Hamby et al "Methods of Providing Contact Between Two Members Normally Separable by an Intervening Member" shows a polymer substrate clad with a copper coating with a dry photopolymer mask. Copper is plated onto portions of copper exposed through the mask, to form printed circuits.

U.S. Pat. No. 3,632,205 of Marcy "Electrooptical Image-Tracing System Particularly for Use with Laser Beams" describes computer control of laser scanning. It mentions thick photoresist and "a substrate which is to be exposed, etched or the like, particularly when microcircuits are to be produced . . . . " The laser beam is driven by means of digital positioning, preferably under computer control. "With a low power laser, masks are produced from photosensitive plates which are exposed to the source. Using a more powerful laser, for example an argon laser, layers of a photoresist, successively deposited on the substrate are directly exposed. Using a very high power laser . . . a mask can be produced using the laser energy to cut a metal plate".

U.S. Pat. No. 4,262,186 of Provancher "Laser Chem-Milling Method, Apparatus and Structure Resulting Therefrom" teaches the provision of a masking template with a hole pattern which is placed over a masked surface of a material to be milled chemically. The mask is then perforated by a laser beam shining through holes in the template. The laser beam remains at each hole for enough time to burn the maskant from the surface of the substrate to be chemically milled. While openings of patterns in a mask are taught by Provancher, it is not taught that one can open a mask by means of independently scanning a laser beam under automatic control or without the use of an intervening template, and it does not teach plating with laser enhancement.

Electroless Plating:

In electroless deposition, a local charge transfer occurs by a discharge of ions at the workpiece-electrolyte interface which is activated by decomposition of a reducing agent at the catalytic surface solution interface. None of the substrate material, onto which the plating occurs, is dissolved.

U.S. Pat. No. 4,239,789 of Blum et al for "Maskless Method for Electroless Plating Patterns" describes a selective plating process for the surfaces of a workpiece in which the workpiece is contacted with a plating solution. During plating, regions to be plated are selectively subjected to a focussed electromagnetic beam which results, at the selected regions, in local heating and an increased plating rate.

Exchange Plating:

In typical exchange plating processes, a surface of a less noble metal is immersed in a solution of a more noble element. The typical metal surface is covered with many cathodic and many anodic regions on a microscopic scale in the form of crystallites and intergranular regions. Because of difference in the electrochemical potential between the grains and the intergranular regions, local electrochemical cells are set up in which the less noble element leaves the electrons behind at the anodic regions and goes into solution in a form of ions. The more noble element ions present in the solution deposit at the cathodic regions where they acquire the electrons released during the dissolution of the less noble metal element. One can deposit Cu onto Ni, Au onto Ni, Au onto Cu and Pd onto Cu. Where the substrate is an insulator carrying a thin film of a metal, dissolution of the less noble metal adjacent to an area to be plated isolates the plated regions electrically.

Kulynych et al "Laser-Enhanced Exchange Plating" IBM Technical Disclosure Bulletin Vol. 23 No. 3, 1262 (August 1980) describes a laser enhanced plating process.

U.S. patent application Ser. No. 287,661, filed July 28, 1981 now U.S. Pat. No. 4,349,583, of Kulynych et al "Laser Enhanced Maskless Method for Plating and Simultaneous Plating and Etching of Patterns" describes a method for high resolution maskless plating with an immersion, exchange or like plating bath. Preferential plating results from exposing those regions where plating is to be performed to an energy beam to increase the plating rate and the resulting highly localized plating thickness is several orders of magnitude greater than is possible by standard immersion techniques.

Maskless Chemical and Electrochemical Machining:

U.S. Pat. No. 4,283,259 of Melcher et al for "Method for Maskless Chemical and Electrochemical Machining" describes a method for high resolution maskless chemical and electrochemical machining. Preferential etching results from exposing those regions where machining is sought to an energy beam. Such exposures can increase the etching rate in the case of electrochemical machining by a factor of 1,000 to 10,000. Such enhancement is sufficient to make masking unnecessary.

SUMMARY OF THE INVENTION

Laser enhanced plating and etching has been described in a number of articles and patents, some of which are referenced above. The purpose and advantage of this technique is achievement of maskless plating and etching at high plating and etching rates respectively. This invention is directed to the resolution of several problems of laser enhanced electrochemical operation. This is particularly so with bulk metallic samples onto which plating is to be performed. The difficulty stems from the high thermal conductivity of the sample which makes confinement of the pattern and the attainment of high plating rates difficult to control. In the case of gold plating, it has been found to be difficult to obtain thick plating of films on the order of 2-5 micrometers thick without some burning or melting of the substrate, heretofore.

In accordance with the instant invention, an automated system is provided whereby standard electroplating and etching and laser and other energy beam enhanced plating and etching processes are carried out on a very localized, selective basis with the use of a focussed laser beam or the equivalent energy beam to open up a masked region. The method of this invention involves encapsulating the sample with a thin, encapsulation material such as glycol phthalate, paraffin, photoresist, gelatin or other polymeric materials which are preferably water insoluble, readily volatalizable, or heat exfoliatable. A laser enhanced electroplating system or etching system or conventional electroplating or etching system includes a continuous electrochemical processing system with a sheet or punched or stamped out series of devices of material to be treated electrochemically passed from a supply roller to a plating bath and out over an exit roller with the rollers and plating system under automatic control. A rinse-tank is provided with the plating tank.

There are several salient features of the instant invention, listed below:

(1) The sheet or stamped pattern (stamped out of a sheet of metal) to be treated electrochemically is coated with a protective film which prevents electrochemical action from occuring where the masking film is present, but which sheet can be removed in the predetermined location. In this application it is proposed to remove the protective masking film where it is desired to form openings in the mask. The removal is performed by means of heating with a laser which is scanned under computer control. Then the plating or etching operation occurs through the openings in the mask.

(2) Preferably, the rinse-tank contains a solvent capable of removing the masking film from the sheet subsequent to the plating or the etching operation.

(3) An array of lasers can be employed.

(4) The array of lasers can be synchronously activated or pulsed.

(5) The electrochemical operation can be performed with the concomitant application of energy from the laser in order to enhance the chemical action in areas from which the masking (protective) film has been removed.

(6) The laser is scanned by means of a mirror which rotates or can be fixed in position.

(7) The masking material is composed of an organic material such as glycol phthalate, paraffin, AZ type positive working photoresist, gelatin, etc.

In an energy beam enhanced electrochemical system for treating a substrate electrochemically in accordance with this invention, the improvement comprising provision of reel-to-reel arrangement of work in electrochemical treatment tanks with media for treatment of the work and automatic application of the energy beam to the work in the desired locations on the work.

Further, in an energy beam enhanced electrochemical system for treating a substrate electrochemically, the improvement comprising application of a protective film to the work to be treated electrochemically, formation of a mask on the substrate with an energy beam, and performing of the treatment electrochemically. Preferably the energy beam irradiates a particular portion of the work, wherein the work comprises a set of moving parts in a reel-to-reel arrangement.

It is preferred that in the above system the energy beam is connected to synchronizing means which initiates its operation to perform locally on the work.

Further in accordance with the above systems, the beam is energized by synchronizing means which initiates its operation to perform locally on the work and to operate for a predetermined length of time, wherein the beam is energized periodically and cyclically in synchronization with movement of the substrate material.

Preferably, the energy beam is scanned with respect to the work to trace a pattern on the substrate with the energy beam in a predetermined pattern.

Preferably, in the tank-to-tank system, the system includes means for laser plating followed with laser heating of the plated substrate to work the metal deposited by heating; and the work is followed by the beam during heat treatment to provide tempering or annealing.

Preferably, in the above systems, a set of split laser beams is included emanating from a single laser or from a multibeam arrangement forming an array of laser beams each of the beams forming a pattern simultaneously. Further, in accordance with this invention a set of split laser beams operates on a pattern simultaneously with varying beam diameters to build up a particular profile, as work passes the beams.

Photolytic dissolution of the bath can be required to provide energy beam enhanced electrochemical treatment with the wavelength of the beam being chosen to match the photon energy required.

The protective film can comprise a dielectric which is selectively removed from the work in response to the beam and an energy beam can be employed to smooth the underlying surface of the work in preparation for plating onto the work through the mask in the film. Preferably, treated regions of the work are rinsed in a solvent for the protective film material forming the mask to eliminate the remaining portions of the coating.

The film can comprise a material selected from the group of dielectrics consisting of glycol phthalate, paraffin, photoresist, gelatin and polymeric films, or inorganic water insoluble films.

DESCRIPTION OF THE PREFERRED EMBODIMENT

Figure 1:
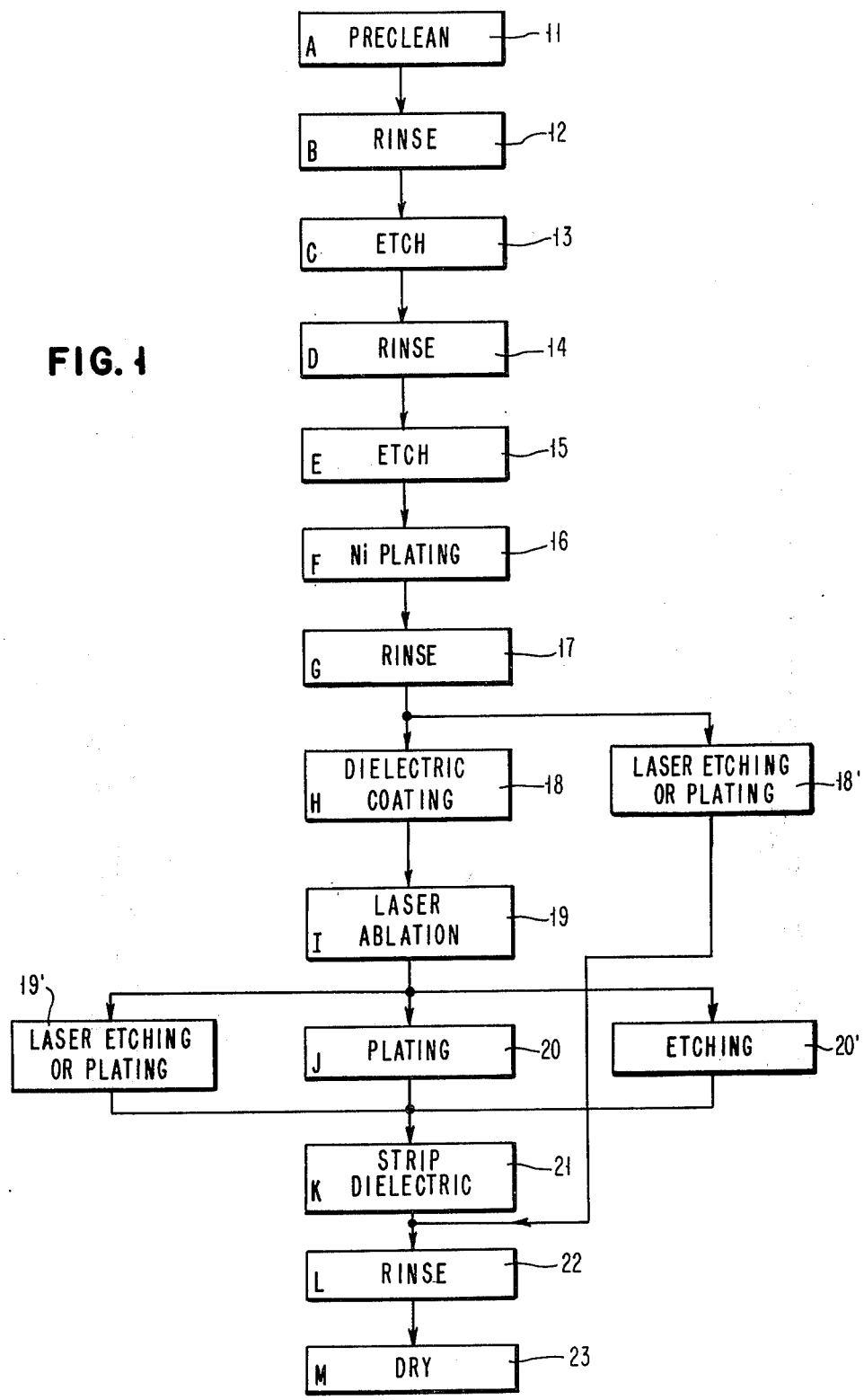
FIG. 1 shows a block diagram of the process of the instant invention and the sequential arrangement of the tanks in the system performing the process.

FIG. 1 shows a flow chart of the process steps which are performed in accordance with this invention.

Each block in the block diagram represents both a process step and a tank for containing a processing liquid. The tank is also used for performing the processing step.

They can be used in reel-to-reel automated laser plating or laser ablation. The examples given relate to plating with gold, but the process is generic to other metals such as silver, copper, nickel, palladium, etc.

STEP A

Figure 5:
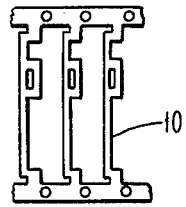
FIG. 5 shows workpieces in an integral stamping adapted for continuous plating.

Tank 11 is the first tank in a series of tanks for continuous processing of materials to be placed or etched. Tank 11 receives work which is first introduced as a continuous sheet or as individual workpieces mounted on a carrier material such as conveyor belt or conveyor chain drive, as with punched work 10 in FIG. 5 formed with integral means for being chain driven.

The solution in the first tank 11 is adapted to pre-cleaning with an alkaline cleaner in order to remove grease. A suitable commercially available product is Alkonox (which is the trade name for a wetting agent and detergent marketed by Alkonox Inc. N.Y., N.Y. 10003) with the workpiece being held in the first tank typically for about two to five minutes at about 65° C.

STEP B

In step B, the work coming out of tank 11 is introduced into tank 12, where it is rinsed. Parts can be sprayed with water for 30 to 60 sec. or can be dipped into agitated deionized or distilled water, or can be both dipped in water and subsequently sprayed with water.

STEP C

Tank 13 is an etching tank which receives work supplied from tank 12 where Be/Cu parts are to be processed in the system, here they are introduced into a solution of 25% $H_2SO_4$ for 30 sec. to 3 minutes at 40° C.

STEP D

The work leaving tank 13 passes into tank 14 where it is rinsed in distilled or deionized water for about 30 to 60 sec. as in Step B.

STEP E

The product from the tank in step 14 is passed into the tank of step 15 where it is etched for 90 sec. in sodium persulfate with a concentration of 20 to 60 grams/liter, which is a typical etchant for Be/Cu parts.

STEP F

The work which has been removed from tank 15 is now plated in a nickel plating bath 16 which typically electroplates to a thickness of about 1 to 2 micrometers for use in electronic applications. This requires on the order of about two to ten minutes.

STEP G

The output work product from tank 16 is now passed to tank 17 where the parts are rinsed in distilled or deionized water but are not dried in order to prepare them for plating. The above steps are employed to prepare the performance of the novel steps described below. At this step in the process of sample preparation there are two alternative techniques which can be followed. (1) Laser ablation can be employed to provide selective plating through a mask 28 deposited as described below. (2) Alternatively, laser enhanced plating (which does not involve the use of a mask at all) can be employed.

ABLATION TECHNIQUE

STEP H

Figure 3:
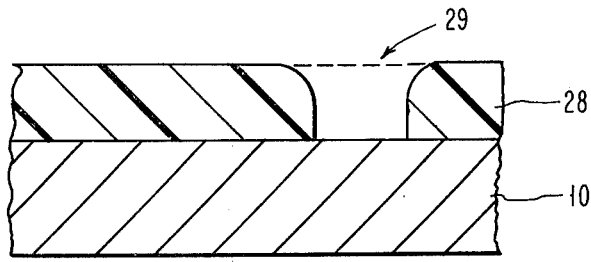
FIG. 3 shows a substrate and a mask formed on the substrate for use in the system of this invention.

The work is now passed from tank 17 into tank 18 which contains the liquid (molten) dielectric material to be coated on every surface of the workpiece by immersing the workpiece in the liquid dielectric material. Suitable dielectric materials are polymers such as molten wax, glycol phthalate, paraffin, gelatin, inorganic materials, photoresist and the like. The parts are exposed to the liquid dielectric medium for a period of time of about ten seconds or less at a temperature in the range of 80° to 95° C. The result is a mask 28 of dielectric medium on all surfaces of the work 10 as shown in FIG. 3 which is adapted to be patterned with openings 29 as described in step I.

In the event that the ablation technique is not to be employed for a specific purpose, but laser enhanced plating and machining or etching in accordance with U.S. Pat. No. 4,217,183 and 4,283,259 then tank 18' is employed to plate the work 10 without any masking. Tank 18' contains a gold plating solution instead of the liquid dielectric. In this case a laser or an array of lasers is focused to irradiate the portions of the work to be plated with gold or the like as the work passes through tank 18'. The movement of the laser beams will define the plated pattern. Plating may be laser enhanced using either the electroplating or the electroless or exchange plating (thermobattery) techniques described in the above patents.

STEP I

Figure 2:
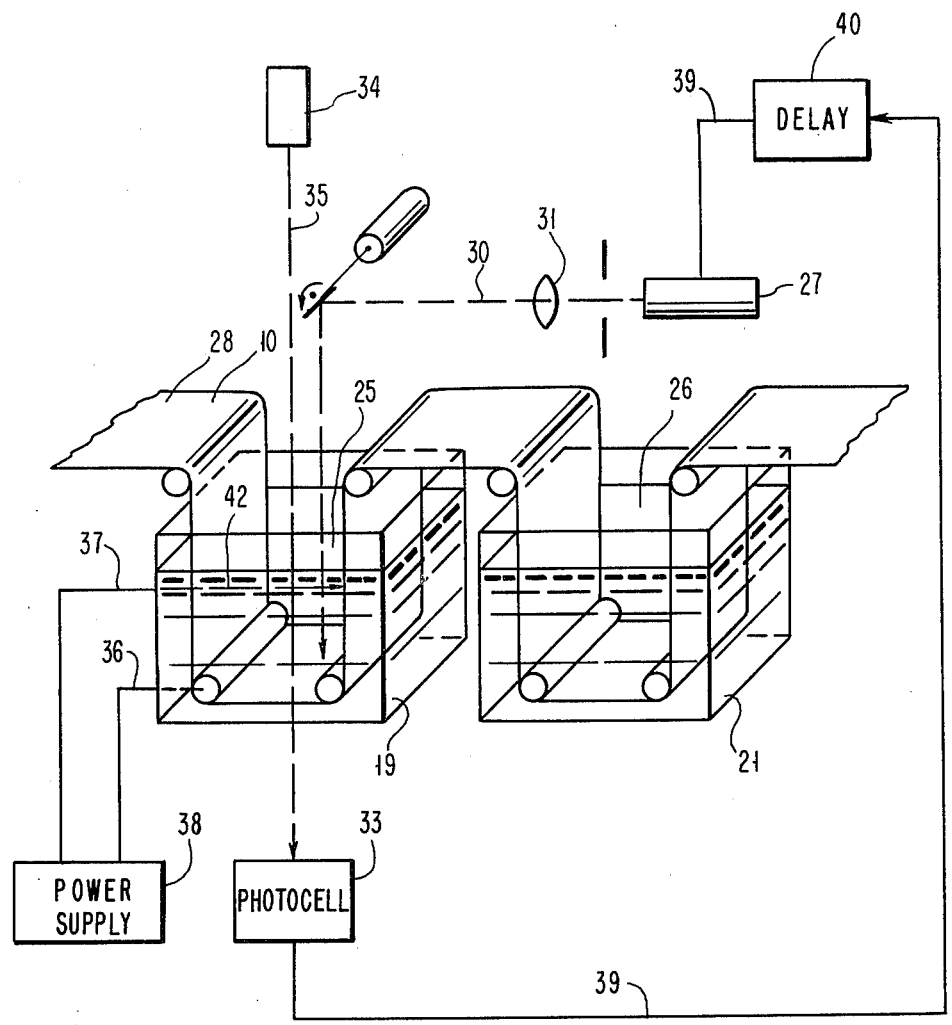
FIG. 2 is a schematic diagram of a portion of the system of FIG. 1, which shows mask formation and plating or etching in the same tank.
Figure 4:
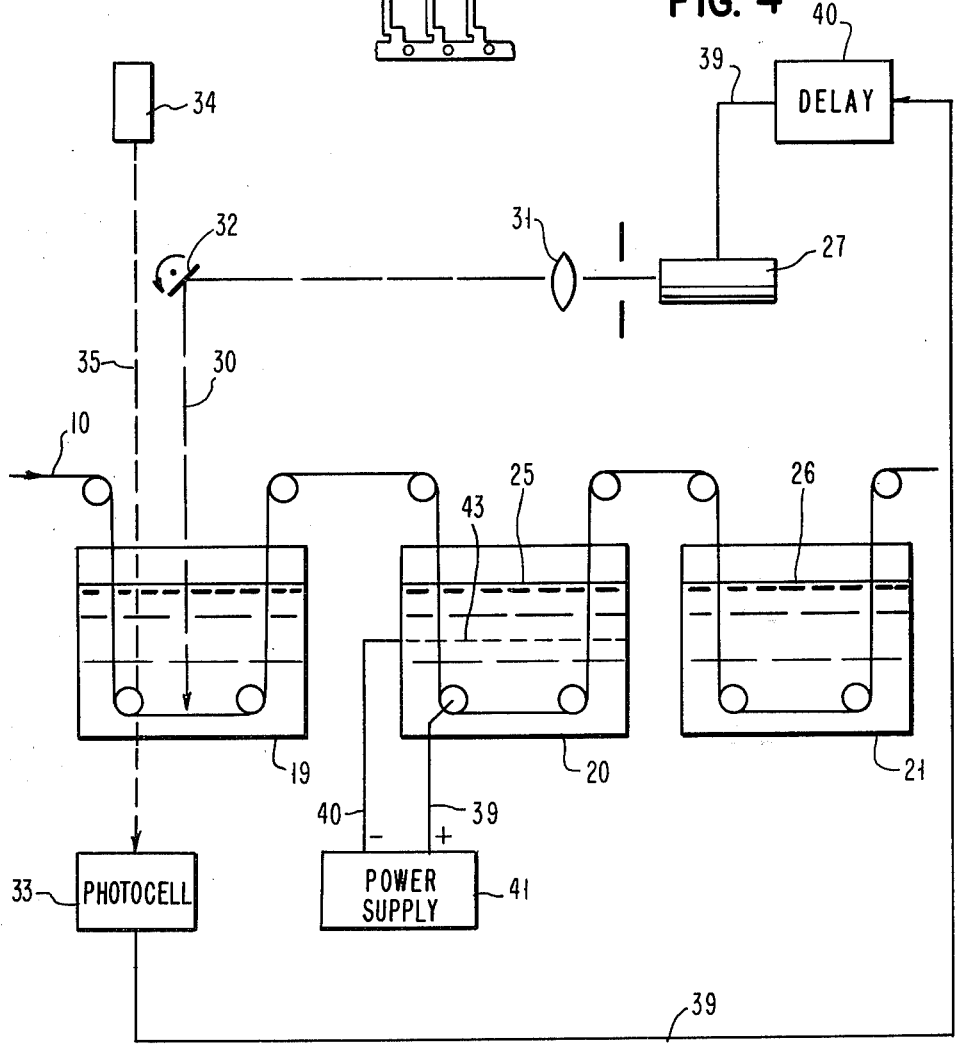
FIG. 4 is a modification of FIG. 2 wherein the mask formation and electrochemical treatment steps are separated.

This is the step of laser ablation performed in tank 19 shown in FIGS. 2 and 4 subsequent to step H when the work 10 is coated with the dielectric mask 28 which is impervious to plating and etching solutions 25 or 26. Here in tank 19, the work can be exposed to one more Q switched lasers 27 (See Industrial Applications of Lasers, p. 48 by J. F. Ready, Academic Press which describes how the Q of a laser cavity can be altered from a low to high Q values by means of Q spoiling and unspoiling apparatus in the laser equipment). A Q switched laser 27 is employed because it is capable of storing energy and subsequently releasing all of the energy extremely quickly, i.e. on the order of 20 nanoseconds with a power intensity as high as $10^9$–$10^{10}$ w/cm$^2$. In our case the intensity is only on the order of $10^6$ w/cm$^2$, because we focus to a $\sim 1$ mm diameter spot. The lasers 27 are employed to remove the dielectric coating where desired in order to provide a patterned mask 28 for electrochemical operations which follow. The dielectric mask 28 is removed selectively by forming openings 29 shown in FIG. 3 in a desired pattern by rapid local laser heating with laser beam 30, from laser 27. The beams 30 from lasers 27 are focussed by lenses 31, reflected by the mirror 32 and applied to regions of the work 10 where plating or etching is to occur. The heat of the laser beam 30 removes the dielectric mask 28 in the desired pattern by dissolving it, ablating it, shattering it due to high differential thermal stresses, or melting it and thereby pulling back the liquid film because of the surface tension forces, or the like. The removal is very local and is confined to the area of the work 10 which is illuminated by the laser beam 30. Generally the laser is adjusted so that in the ablation step, no damage occurs on the workpiece. A laser wavelength is chosen to be transparent to the dielectric but absorbing by the workpiece such as 1.06 mm with photoresist on a nickel plate Be/Cu substrate. Alternatively, the laser wavelength can be chosen to be absorbed in the working material, for example an eximer laser (UV) with standard photoresist working material. For many materials this dissolution process or a similar process for forming a dielectric mask can be performed in the electrochemical bath 25 which is to operate upon the workpiece (as shown in FIG. 2) subsequently, without modifying the effectiveness of the electrochemical (plating or etching) bath 25. As would be manifest to those skilled in the art it is preferable that the power of the laser beam 30 employed will be lower than a level at which the work 10 would be damaged, melted or otherwise modified by the heat of the beam 30, where that is likely to affect a change in the ultimate product. Typical pulses will be on the order of 20 ns ($20 \times 10^{-9}$ sec.) or more in duration. The uncovered portions of the work 10 are to be plated (or etched) by conventional etching and plating techniques. The operation of the stripping lasers 27 which write the patterns onto the work 10 can be initiated by means of a work sensing transducer 33. For example, a photoelectric sensor 33 can be employed in the form of a photocell onto which a beam from a low intensity continuous wave (C.W.) laser 34 is incident. Upon passage of the work 10 between the cell 33 and the laser beam 35 (located either on opposite sides of the work 10 or on the same side with reflection) the photoelectric cell 33 generates a voltage signal which activates the controls of the Q switched laser 27 to discharge the stored energy and produce an output beam. A synchronized delay system 40 connected between cell 33 and laser 27 by lines 39 can be employed with a potentiometer which adjusts an RC delay circuit so that the laser 27 is discharged just at the point at which the part to be treated is lined up with the Q switched laser 27. The amount of the delay required will depend upon the speed with which the work 10 moves through the tank 19, i.e. the reel speed. If the work is to be plated in the next tank 20 as in FIG. 4, then the work 10 is sprayed with water to prevent oxidation of the region of the work which has been exposed during the laser stripping process which has just removed the selected areas 29 in FIG. 3 of the dielectric masking coating 28. In FIGS. 2 and 4 the lasers are directed to the work 10 by means of the scanning mirror 32 which causes the beam 30 to move. It is possible for the beam 30 to follow the work 10 at the same speed as the work 10 is moving, during a portion of its trip through the tank 19. In general the use of a scanning mirror is not required. If the mirror 32 is stationary, then the laser beam 30 is incident on the work 10 while the work moves relative to the fixed beam 30. To trigger the laser 27, a secondary laser 34 and photocell 33 are used as already described for the ablation technique.

The speed of the work 10 moving through the plating tank 19 in FIGS. 2 and 19 in FIG. 4 is set to result in the appropriate dwell time of the laser 27 and the particular kind of work being treated, to yield the required thickness of the plated film. Known (measured) plating rates measured as a function of laser power and dwell time allows one to set the speed of the moving parts at the appropriate level. One can employ variable spot sizes through changes in focus. An example follows:

EXAMPLE

A single laser beam is set so that 1 micrometer of plating occurs for a dwell time of 0.5 sec. A gold stripe is to be plated with dimensions of 0.5 mm in length and 0.25 mm in width. In order to obtain the desired plating width, the beam is focussed to produce a gaussian half width of 0.25 mm. This means the intensity of the laser as a function of position as measured from the center of the beam is related by the equation $$I = I_0 e^{-\frac{r}{(.25mm)^2}}$$

where $I_0$ is the intensity at the center of the beam, $r = 0$. The speed with which the work 10 is moving through the tank relative to the laser beam 30 is determined from the equation $v = BD/t$ where $v$ is the speed of the work 10, BD is the beam diameter, and $t$ is the dwell time needed to provide the thickness of plating required. In this example, the value of $v = 0.5$ mm/sec. Assume the work has a width of 2 mm where the portion of the surface to be plated is located in the center of the 2 mm. A delay time of 1.5 sec. is introduced once the part passes the auxiliary trigger laser beam 35 from laser 34 so that plating will start 0.75 mm from the edge of the work area sensed. The laser 27 will be turned off after 0.5 sec. by using a circuit (not shown) inside system 27 with a variable time constant set to that value in laser system 27.

For a center-to-center spacing of 3 mm between workpieces 10, where there are separate workpieces 10, on a conveyor, one part is produced in about 6 seconds. Another aspect of this subject is the duty cycle of the laser 27. In the present example the laser is on for only 0.5 mm per 3 mm of travel. At 0.5 mm of travel/sec., it takes 6 sec. to travel 3 mm, so that the duty cycle is a measure of the number of workpieces per unit time. However, the process can be accelerated by increasing the duty cycle.

(1) A first arrangement which makes this possible is a scanning mirror 32. Mirror 32 scans the beam 30 so that it moves with respect to the moving workpiece 10 at 0.5 mm/sec. for a duration of 1 sec. Subsequently, the beam 30 scans back to a zero position in a fraction of a second. By this technique, the parts rate per second is increased to 1/sec. with a velocity v of 3 mm/sec.

(2) As an alternative to the single laser beam 30, N laser beams can be employed, positioned parallel to the direction of the moving workpieces 10. The N beams can be obtained from a single beam by using a set of beam splitters or from a set of N lasers. It is understood that N is an integer greater than 1. The process is now accelerated by a factor of N if each laser beam 30 uses a separate scanner so that each beam is causing plating 100% of the time, as contrasted with the scanner system of (1) above. Techniques described above are applicable to laser etching via the ablation method which produces the desired pattern by opening a pathway in a mask 28 which is then used to control the pattern of etching chemically or by laser etching. Alternatively, direct laser enhanced etching without any masking can be employed in accordance with U.S. Pat. No. 4,217,183 above. In the latter method, the laser beam 30 defines the pattern to be etched with the workpiece 10 to be etched electrically connected to a power supply 38 as an anode via line 36. Alternatively, the laser beam arrays 30 can be activated synchronously.

FIBER OPTICS

Fiber optics can also be employed to direct the beams from the laser to the workpiece, particularly if the solution is highly absorbing or the areas to be plated are not in a direct line of sight readied readily by the laser.

STEP J

If the plating step was not performed in the tank 19 concomitantly with the laser ablation step, then the plating is performed in tank 20 during step J, which is a separate plating step as shown in FIG. 1. Here or in step I, the gold, gold alloy or other metal plating is performed using a conventional plating solution. For example, a conventional gold plating solution is employed for electroplating for 2-10 minutes, depending upon the desired thickness of the plated gold desired. Hard or soft gold can be plated over the laser ablated regions on the work 10 where the mask 28 has been removed. In tank 20, in FIG. 4 the plating solution comprises solution 26. The current for plating is supplied from cathode line 39 attached electrically from power supply 41 to one of the rollers which contacts the work 10 which is presumed to be conductive. The anode is attached to line 40 from the power supply 41. In FIG. 2, similar connections are shown from the power supply 38 associated with tank 19 which connect the cathode line 36 to a roller in tank 19 which connects to work 10 and the anode line 37. The anodes 42 and 43 are suspended in the tanks 19 and 20 respectively in FIGS. 2 and 4.

STEP K

After the laser plating, electroplating, exchange plating, or etching steps are completed if a mask has been employed then the mask 28 may be removed leaving only the gold or other metal patterns or etched patterns provided by the laser patterning process steps above. In tank 21, a mask dissolving solvent 26 is employed to strip away the remaining portion of the mask 28 from the plated work 10. That is, the mask 28 which was not removed by the laser beam 30 is now removed by the stripping solvent 26 in tank 21. Examples of suitable stripping solvents 26 for the masking material are listed here. Acetone for photoresist, alcohol for wax or paraffin, acetone for glycol phthalate, or hot water and/or steam under pressure for paraffin or glycol phthalate. The steam may be followed by an additional organic clean up by means of acetone, alcohol and/or freon flurohydrocarbon or other suitable organic residue removal agent or simply by applying heat.

STEP L

In step L, the work 10 moves into a tank 22 which rinses away the residual solvent 26 from the surface of the work 10. The tank contains water or uses a water spray (deionized or distilled).

Having thus described our invention, what we claim as new, and desire to secure by Letters Patent is:

1. In an energy beam enhanced electrochemical system for treating a substrate electrochemically, the improvement comprising;
    application of a protective film to the work to be treated electrochemically, formation of a mask on said substrate with an energy beam, and
    performing of said treatment electrochemically.

2. A system in accordance with claim 1 wherein said energy beam irradiates a particular portion of said work, wherein said work comprises a set of moving parts in a reel-to-reel arrangement 3. A system in accordance with claim 1 wherein said energy beam is connected to synchronizing means which initiates its operation to perform locally on said work.

4. A system in accordance with claim 1 wherein said beam is energized by synchronizing means which initiates its operation to perform locally on said work and to operate for a predetermined length of time, wherein said beam is energized periodically and cyclically in synchronization with movement of said substrate material.

5. A system in accordance with claim 1 wherein said energy beam is scanned with respect to said work to trace a pattern on said substrate with said energy beam in a predetermined pattern.

6. A system in accordance with claim 1 wherein said work is followed by said beam during heat treatment to provide tempering or annealing.

7. A system in accordance with claim 1 with a set of split laser beams emanating from a single laser or from a multibeam arrangement forming an array of laser beams each of said beams forming a pattern simultaneously.

8. A system in accordance with claim 1 wherein a set of split laser beams operates on a pattern simultaneously with varying beam diameters to build up a particular profile, as work passes the beams.

9. A system in accordance with claim 1 wherein said film comprises a dielectric which is selectively removed from said work in response to said beam and an energy beam is employed to smooth the underlying surface of said work in preparation for plating onto said work through said mask in said film.

10. A system in accordance with claim 1 or 9 wherein said treated regions of said work are rinsed in a solvent for said protective film material forming said mask to eliminate the remaining portions of said coating.

11. A system in accordance with claim 1 wherein said film comprises a material selected from the group of dielectrics consisting of glycol phthalate, paraffin, photoresist, gelatin and polymeric films or inorganic water insoluble films.

12. In an energy beam enhanced electrochemical system for treating a substrate electrochemically, the improvement comprising;
    provision of reel-to-reel arrangement of work in electrochemical treatment tanks with media for treatment of the work and automatic application of said energy beam to said work in the desired locations on said work, and
    a set of split laser beams emanating from a single laser or from a multibeam arrangement forming an array of laser beams each of said beams forming a pattern simultaneously.

13. In an energy beam enhanced electrochemical system for treating a substrate electrochemically, the improvement comprising:
provision of reel-to-reel arrangement of work in electrochemical treatment tanks with media for treatment of the work and automatic application of said energy beam to said work in the desired locations on said work, and
a set of split laser beams operating on a pattern simultaneously with varying beam diameters to build up a particular profile, as work passes the beams.

14. In an energy beam enhanced electrochemical system for treating a substrate electrochemically, the improvement comprising;
provision of reel-to-reel arrangement of work in electrochemical treatment tanks with media for treatment of the work and automatic application of said energy beam to said work in the desired locations on said work,
said system including means for laser plating followed with laser heating of the plated substrate to work the metal deposited heating.

15. In an energy beam enhanced electrochemical system for treating a substrate electrochemically, the improvement comprising:
a bath and a reel-to-reel arrangement of work in electrochemical treatment tanks with media for treatment of the work and with automatic application of said energy beam to said work in the desired locations on said work,
a bath adapted for photolytic dissolution means for providing photolytic dissolution of said bath by energy beam enhanced electrochemical treatment, the wavelength of said beam matching the photon energy required to provide said photolytic dissolution of said bath.

* * * * *